(12) United States Patent
Seok et al.

(10) Patent No.: US 10,622,421 B2
(45) Date of Patent: Apr. 14, 2020

(54) ORGANIC LIGHT EMITTING DISPLAY APPARATUS

(71) Applicant: LG Display Co., Ltd., Seoul (KR)

(72) Inventors: Han Byeol Seok, Seoul (KR); Se Hee Lee, Paju-si (KR); Eun Jung Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/065,751

(22) PCT Filed: Jun. 3, 2016

(86) PCT No.: PCT/KR2016/005877
§ 371 (c)(1),
(2) Date: Jun. 22, 2018

(87) PCT Pub. No.: WO2017/111223
PCT Pub. Date: Jun. 29, 2017

(65) Prior Publication Data
US 2019/0006445 A1    Jan. 3, 2019

(30) Foreign Application Priority Data

Dec. 23, 2015 (KR) .................. 10-2015-0184881

(51) Int. Cl.
*H01L 27/32* (2006.01)
*H01L 51/50* (2006.01)
*G09G 3/3258* (2016.01)

(52) U.S. Cl.
CPC ....... *H01L 27/3246* (2013.01); *G09G 3/3258* (2013.01); *H01L 27/3211* (2013.01);
(Continued)

(58) Field of Classification Search
CPC .............. H01L 27/3246; H01L 27/3283
See application file for complete search history.

(56) References Cited

U.S. PATENT DOCUMENTS 10,074,823 B2 * 9/2018 Kang ............... H01L 51/5212
2007/0159110 A1 * 7/2007 Weng .................. A43B 3/001
315/185 S (Continued)

FOREIGN PATENT DOCUMENTS

| EP | 2541636 A1 | 1/2013 |
| JP | 2007-305331 A | 11/2007 |
| JP | 2010-225403 A | 10/2010 |

OTHER PUBLICATIONS

PCT International Search Report, PCT Application No. PCT/KR2016/005877, dated Aug. 30, 2016, 3 pages.

(Continued)

*Primary Examiner* — Kyoung Lee
*Assistant Examiner* — Christina A Sylvia
(74) *Attorney, Agent, or Firm* — Fenwick & West LLP

(57) ABSTRACT

Provided is an organic light emitting display apparatus. The organic light emitting display apparatus includes: a first anode; a second anode which spaced apart from the first anode; a bank between the first anode and the second anode; and at least one common layer extending onto a top surface of the first anode, a top surface of the bank, and a top surface of the second anode, in which a perimeter of the top surface of the bank on the cross-section is 7π μm or larger. Accordingly, current leakage between adjacent sub pixels may be minimized.

10 Claims, 6 Drawing Sheets

(52) U.S. Cl.
CPC ...... *H01L 27/3283* (2013.01); *H01L 51/5056* (2013.01); *G09G 2320/0233* (2013.01); *G09G 2330/021* (2013.01); *H01L 51/5088* (2013.01)

(56) References Cited

U.S. PATENT DOCUMENTS

| | | | |
|---|---|---|---|
| 2007/0252518 A1* | 11/2007 | Lee ..................... | H01L 27/3283 313/504 |
| 2009/0215350 A1* | 8/2009 | Takei .................. | H01L 27/3246 445/23 |
| 2010/0051912 A1* | 3/2010 | Gregory .............. | H01L 27/3246 257/40 |
| 2013/0001607 A1* | 1/2013 | Goda .................. | H01L 51/5088 257/88 |
| 2013/0140529 A1 | 6/2013 | Seong et al. | |
| 2013/0140589 A1* | 6/2013 | Kwak ................. | H01L 51/5203 257/89 |

OTHER PUBLICATIONS

PCT Written Opinion, PCT Application No. PCT/KR2016/005877, dated Aug. 30, 2016, 7 pages.

\* cited by examiner

ORGANIC LIGHT EMITTING DISPLAY APPARATUS

TECHNICAL FIELD

The present disclosure relates to an organic light emitting display apparatus, and more particularly, to an organic light emitting display apparatus in which current leakage caused by a common layer which is shared by adjacent sub pixels is reduced.

BACKGROUND ART

An organic light emitting display apparatus (OLED apparatus) is a next-generation display apparatus having self-luminance characteristics. Specifically, the organic light emitting display apparatus is a display apparatus in which holes and electrons injected from an anode and a cathode are recoupled to each other in a light emitting layer to form an exciton and light having a specific wavelength is generated by emitting energy of the exciton.

The OLED apparatus does not need a separate light source unlike a liquid crystal display apparatus. Thus, the OLED apparatus can be manufactured into a lightweight and thin form. Further, the OLED apparatus is advantageous in terms of a viewing angle, a contrast ratio, a response speed, and power consumption, as compared with a liquid crystal display apparatus. Therefore, the OLED apparatus has been researched as a next-generation display apparatus.

DISCLOSURE OF INVENTION

Technical Problem

Summary

The OLED apparatus may include a light emitting layer having a patterned structure according to designs.

The OLED apparatus including a light emitting layer having a patterned structure has a structure in which organic light-emitting layers emitting different color light are separated for every sub pixel. For example, a red light emitting layer emitting red light, a green light emitting layer emitting green light, and a blue light emitting layer emitting blue light are configured to be separated in a red sub pixel, a green sub pixel, and a blue sub pixel, respectively. In each of the red light emitting layer, the green light emitting layer, and the blue light emitting layer, holes and electrons supplied through two electrodes are coupled to each other to emit light. A pattern of each of the light emitting layers may be deposited using a mask which is open for every sub pixels, for example, a fine metal mask (FMM).

Additional organic layers, such as an injecting layer or a transporting layer, which improve a light emission efficiency of the organic light-emitting device may be further disposed between two electrodes, in addition to the light-emitting layer. At least some organic layers among the additional organic layers may have a common structure to be commonly disposed for a plurality of sub pixels, in order to achieve an advantage on a manufacturing process.

Here, the layer having the common structure may be formed using the same mask in which all sub pixels are open. The layer having the common structure may be deposited as the same structure in all the sub pixels with no particular pattern for every sub pixel. That is, a layer having the common structure is disposed to be extend from one sub pixel to another without a disconnected portion so that the common layer is shared by a plurality of sub pixels. The layer having the common structure may be referred to as a common layer or a common structure layer.

For example, in addition to the light emitting layer, a hole injecting layer or a p-type hole transporting layer may be further disposed between two electrodes to allow the hole to smoothly move. On the p-type hole transporting layer, a p-type dopant formed of an inorganic material is doped. The hole injecting layer or the p-type hole transporting layer may have a common structure to be shared by the plurality of sub pixels.

However, there are following problems. Like the hole injecting layer or the p-type hole transporting layer, at least some organic layers among the additional organic layers are configured to have the common structure. Therefore, when a driving voltage is applied to a specific sub pixel, the current flows to adjacent sub pixels through the hole injecting layer or the p-type transporting layer having the common structure, that is, current leakage may occur. Due to the current leakage, another unexpected sub pixel emits light causing color mixture between sub pixels. Further, brightness of a sub pixel is lowered. Therefore, the current leakage is a major cause of lowering a display quality of the OLED apparatus and increasing power consumption.

The color mixture problem between sub pixels by the current leakage may be more serious when the OLED apparatus is driven at a low gray scale. That is, at an initial time to reach a turn-on voltage applied between two electrodes, the color mixture problem between sub pixels may be more seriously generated due to a difference of turn-on voltages of adjacent sub pixels.

Here, the turn-on voltage refers to a driving voltage which is applied to an organic light-emitting device at a time when light is emitted from one sub pixel. In other words, the turn-on voltage is a minimum value of a driving voltage to drive one sub pixel. Further, the gray scale refers to a number of minimum brightness units which can be represented by the organic light-emitting device or levels of individual steps. The gray scale is increased as a driving voltage is increased since a time when the turn-on voltage is applied. In this specification, in the entire gray scales of the organic light-emitting device, a level corresponding to approximately lower 30% of gray scales refers to a low gray scale. For example, when the organic light-emitting device has 0 to 255 gray scales, 0 to 85 gray scales may be considered as low gray scales.

The above-described OLED apparatus including a light emitting layer having a patterned structure has a different turn-on voltage due to difference of the light emitting layer for every sub pixel. For example, a turn-on voltage which drives the red sub pixel on which the red light emitting layer is disposed may be lower than a turn-on voltage which drives the blue sub pixel on which the blue light emitting layer is disposed.

As described above, with the structure in which the turn-on voltages of adjacent sub pixels are different from each other, when a sub pixel having a higher turn-on voltage is driven, undesired light may be generated in an adjacent pixel having a lower turn-on voltage. A barrier of the sub pixel having a lower turn-on voltage through which the current flows is lower than that of the sub pixel having a higher turn-on voltage. Therefore, the current leaked through the additional organic layer having a common structure easily flows to the sub pixel having a lower turn-on voltage than the sub pixel having a higher turn-on voltage.

Therefore, even though the driving voltage is not applied, the light may be emitted from the sub pixel having a low turn-on voltage.

Therefore, an object of an exemplary embodiment of the present disclosure is to provide an organic light emitting display apparatus in which current leakage between adjacent sub pixels is minimized by optimizing a shape of a bank, without changing a design of the light-emitting device.

Objects of the exemplary embodiment of the present disclosure are not limited to the above-mentioned objects, and other objects, which are not mentioned above, can be clearly understood by those skilled in the art from the following descriptions.

An aspect of the present disclosure provides an organic light emitting display apparatus, including: a first anode; a second anode spaced apart from the first anode; a bank between the first anode and the second anode; and at least one common layer extending onto a top surface of the first anode, a top surface of the bank, and a top surface of the second anode, in which a perimeter of the top surface of the bank on the cross-section is $7\pi$ μm or larger. Accordingly, current leakage between adjacent sub pixels may be minimized.

Another aspect of the present disclosure provides an organic light emitting display apparatus including a plurality of anodes, a cathode on the plurality of anodes; at least one common layer between the plurality of anodes and the cathodes and shared among adjacent sub pixels; and a bank that divides the adjacent sub pixels and covers ends of the plurality of anodes, in which the bank has a shape in which a leaked current flowing onto the common layer disposed on the bank has a value of 15 μA or lower.

According to the exemplary embodiment of the present disclosure, a bank has a shape which may increase a resistance of a common layer on a top surface of the bank. Therefore, the current leakage between adjacent sub pixels may be reduced.

According to the exemplary embodiment of the present disclosure, a perimeter of the top surface of the bank on a cross-section is optimized. Therefore, the current which is leaked through the common layer disposed on the bank is reduced, thereby improving a display quality of the organic light emitting display apparatus.

According to an exemplary embodiment of the present disclosure, a shape of a bank between adjacent sub pixels is optimized without changing a design of the light-emitting device, to reduce the current leakage. Therefore, the light-emitting device may be freely designed.

According to the exemplary embodiment of the present disclosure, the perimeter of the top surface of the bank is optimized without changing an interval between adjacent sub pixels. Therefore, an aperture ratio may increase.

According to an exemplary embodiment of the present disclosure, the current leakage between the adjacent sub pixels is minimized by optimizing a shape of the bank. Therefore, there is no need to reduce an amount of an inorganic material included in the common layer of the organic light-emitting device, so that a lifetime of the organic light emitting display apparatus may be prolonged.

Objects of the present disclosure are not limited to the above-mentioned objects, and other objects, which are not mentioned above, can be clearly understood by those skilled in the art from the following descriptions.

The objects to be achieved by the present disclosure, the means for achieving the objects, and effects of the present disclosure described above do not specify essential features of the claims, and, thus, the scope of the claims is not limited to the disclosure of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1:
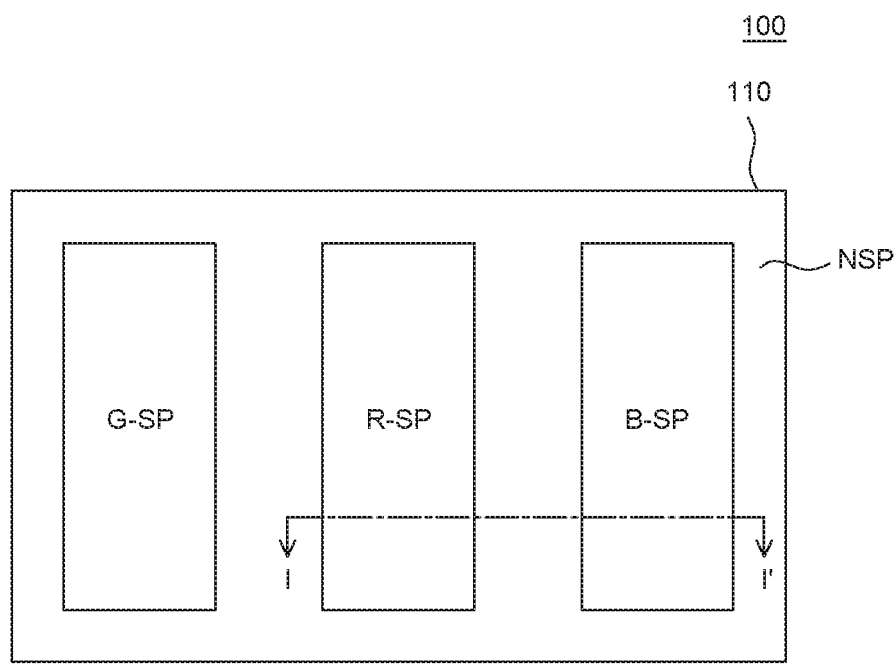
FIG. 1 is a plane view illustrating an organic light emitting display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description, a detailed explanation of known related technologies may be omitted to avoid unnecessarily obscuring the subject matter of the present disclosure.

The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When the relation of a time sequential order is described using the terms such as "after", "continuously to", "next to", and "before", the order may not be continuous unless the terms are used with the term "immediately" or "directly".

Although the terms "first", "second", and the like are used for describing various components, these components are not confined by these terms. These terms are merely used for distinguishing one component from the other components.

Therefore, a first component to be mentioned below may be a second component in a technical concept of the present disclosure.

A size and a thickness of each component illustrated in the drawing are illustrated for convenience of description, and the present disclosure is not limited to the size and the thickness of the component illustrated.

The features of various embodiments of the present disclosure can be partially or entirely bonded to or combined with each other and can be interlocked and operated in technically various ways, and the embodiments can be carried out independently of or in association with each other.

Hereinafter, exemplary embodiments of the present disclosure will be described in detail with reference to the accompanying drawings as follows.

Figure 2:
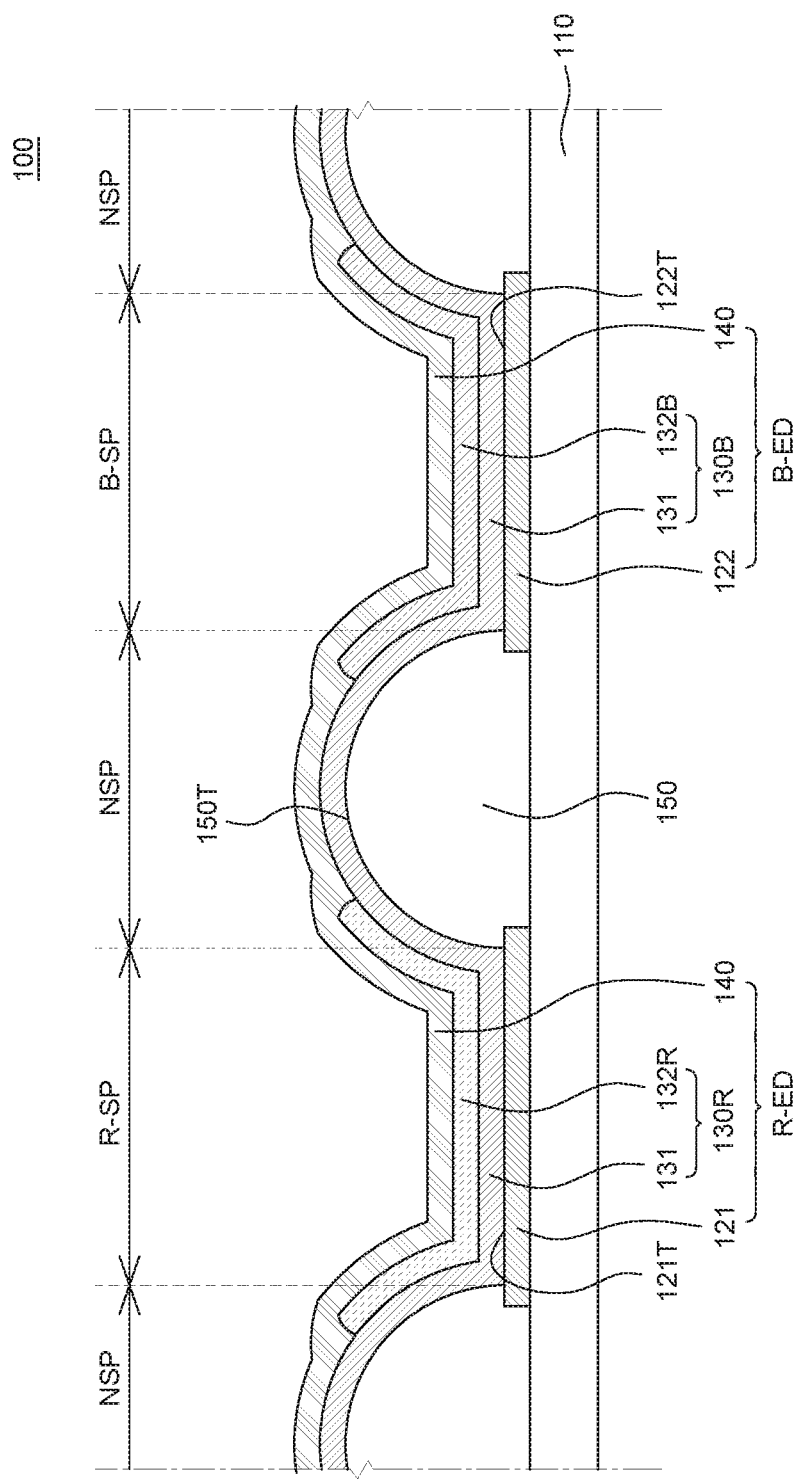
FIG. 2 is a cross-sectional view taken along the line I-I' of FIG. 1.

FIG. 1 is a plane view illustrating an organic light emitting display apparatus 100 according to an exemplary embodiment of the present disclosure. FIG. 2 is a cross-sectional view taken along the line I-I' of FIG. 1. Referring to FIGS. 1 and 2, the organic light emitting display apparatus 100 includes a substrate 110, a plurality of organic light-emitting devices ED, and a bank 150.

Referring to FIG. 1, the organic light emitting display apparatus 100 includes a plurality of sub pixels SP and a non-sub pixel NSP. The sub pixel SP refers to a minimum unit of an area where the light is actually emitted and also referred to as a sub pixel area. The non-sub pixel Non-SP refers to a remaining area where no light is emitted. Further, a plurality of sub pixels R-SP, G-SP, and B-SP are configured to become one pixel which forms white light. For example, as illustrated in FIG. 1, a red sub pixel R-SP, a green sub pixel G-SP, and a blue sub pixel B-SP form one pixel.

The organic light emitting display apparatus 100 includes a light-emitting device ED in every sub pixel. Specifically, the red light-emitting device R-ED is located in the red sub pixel R-SP, the blue light-emitting device B-ED is located in the blue sub pixel B-SP, and the green light-emitting device G-ED is located in the green sub pixel G-SP. In FIG. 2, for the convenience of description, only the red light-emitting device R-ED and the blue light-emitting device B-ED of adjacent sub pixels R-SP and B-SP are illustrated. Further, even though not illustrated in the drawing, each sub pixel G-SP, R-SP, and B-SP may further include at least one thin film transistor and a capacitor which supply various signals to the light-emitting devices G-ED, R-ED, and B-ED.

A main peak wavelength of light emitted from the red sub pixel R-SP or the red light-emitting device R-ED may be in the range of 600 nm or higher and 650 nm or lower. Further, a main peak wavelength of light emitted from the green sub pixel G-SP or the green light-emitting device G-ED may be in the range of 510 nm or higher and 560 nm or lower. Furthermore, a main peak wavelength of light emitted from the blue sub pixel B-SP or the blue light-emitting device B-ED may be in the range of 430 nm or higher and 480 nm or lower.

Referring to FIG. 2, the red light-emitting device R-ED is disposed in the red sub pixel R-SP. The red light-emitting device R-ED includes a first anode 121, a cathode 140, and a red light-emitting unit 130R which includes a common layer 131 and a red light-emitting layer 132R. The red light-emitting device R-ED emits red light. Further, the blue light-emitting device B-ED is disposed in the blue sub pixel B-SP. The blue light-emitting device B-ED includes a second anode 122, a cathode 140, and a blue light-emitting unit 130B which includes a common layer 131 and a blue light-emitting layer 132B. The blue light-emitting device B-ED emits blue light.

A plurality of anodes 121 and 122 is disposed on the substrate 110 to be spaced apart from each other. Specifically, the first anode 121 is disposed corresponding to the red sub pixel R-SP and the second anode 122 is disposed corresponding to the blue sub pixel B-SP.

Here, when two components correspond to each other, as seen from a cross-section, in view of a vertical relationship of two components, one of the two components is completely overlaid with the other component, regardless of presence of another component between the two components. It may be represented using various terms.

The first anode 121 and the second anode 122 overlap the red sub pixel R-SP and the blue sub pixel B-SP, respectively. The first anode 121 and the second anode 122 are disposed to be separated from each other for every sub pixel R-SP and B-SP. The first anode 121 and the second anode 122 are electrodes which supply or transfer holes to the light-emitting layers 132R and 132B of the light-emitting units 130R and 130B. When the organic light emitting display apparatus 100 according to an exemplary embodiment of the present disclosure employs a top emission method, the first anode 121 and the second anode 122 may further include reflective layers, respectively, to reflect light emitted from the light-emitting units 130R and 130B. Therefore the light may be emitted upwardly (or in a direction passing though the cathode 140). For example, the first anode 121 and the second anode 122 may be configured to have a double layered structure in which a transparent layer and a reflective layer are deposited or a triple layered structure in which a transparent layer, a reflective layer, and a transparent layer are deposited. The transparent layer is formed of a transparent conductive oxide (TCO) material such as indium tin oxide (ITO) or indium zinc oxide (IZO). The reflective layer may be formed of a metal material such as copper (Cu), silver (Ag), or palladium (Pd).

The red light-emitting unit 130R including the common layer 131 and the red light-emitting layer 132R is disposed on the first anode 121. The blue light-emitting unit 130B including the common layer 131 and the blue light-emitting layer 132B is disposed on the second anode 122.

The common layer 131 is a layer having a common structure. As illustrated in FIG. 2, the common layer 131 is disposed to extend onto a top surface 121T of the first anode 121, a top surface 150T of the bank 150, and a top surface 122T of the second anode 122. In other words, the common layer 131 is deposited to have the same structure for all sub pixels, without specific patterns for each of the sub pixels. Further, the common layer 131 is connected or extends from one sub pixel B-SP to another sub pixel R-SP without having a disconnected portion so that the common layer 131 is shared by a plurality of sub pixels.

The common layer 131 may include at least one of a hole injecting layer, a hole transporting layer, and a p-type hole transporting layer. The hole injecting layer, the hole transporting layer, or the p-type hole transporting layer on which a p type dopant is doped, serves to smoothly transfer the holes supplied from the anodes 121 and 122 to the light-emitting layers 132R and 132B. Further, the hole injecting layer, the hole transporting layer, or the p-type hole transporting layer improves a hole injecting capacity of the light-emitting device ED, thereby contributing to improve the light emission efficiency.

The red light emitting layer 132R and the blue light emitting layer 132B have patterned structures. As illustrated in FIG. 2, the red light-emitting layer 132R corresponds to the red sub pixel R-SP and the blue light-emitting layer 132B corresponds to the blue sub pixel B-SP. Further, the red light-emitting layer 132R and the blue light emitting layer 132B are configured to be separated from each other. Alternatively, the red light-emitting layer 132R overlaps the first anode and the blue light-emitting layer 132B overlaps the second anode 122.

Here, when two components overlap each other, as seen from a cross-section, in view of vertical relationship of two components, one of the two components is at least partially overlaid with the other component, regardless of presence of another component between the two components. It may be represented using various terms.

The light-emitting layers 132R and 132B may have the same size as each sub pixel R-SP or B-SP. Even though the light-emitting layers 132R and 132B do not have the completely same size as the sub pixel, the light-emitting layers 132R and 132B may be disposed to be spaced apart from each other between adjacent sub pixels R-SP and B-SP. For example, the light-emitting layers 132R and 132B included in each light-emitting device R-ED or B-ED extend onto the top surface 150T of the bank 150 beyond the sub pixel R-SP or B-SP as illustrated in FIG. 2. Two adjacent light emitting layers 132R and 132B may be disposed on the top surface 150T of the bank 150 to be spaced apart from each other. Alternatively, even though not illustrated in the drawings, in accordance with a mask design, at least parts of two adjacent light-emitting layers 132R and 132B may overlap each other on the top surface 150T of the bank 150.

Each of the light emitting layers 132R and 132B includes at least one host and at least one dopant. The dopant is a material which is added to obtain light having a desired wavelength and the host is a material which transfers energy to the dopant.

A turn-on voltage to drive each of the sub pixels R-SP and B-SP may vary depending on the material of the light-emitting layers 132R and 132B. For example, in accordance with a composition of the material of the light-emitting layers 132R and 132B, a turn-on voltage to drive the red sub pixel R-SP including the red light-emitting layer 132R may be lower than a turn-on voltage to drive the blue sub pixel B-SP including the blue light-emitting layer 132B. In other words, a minimum value of the driving voltage applied to the first anode 121 allowing the blue light-emitting layer 132B to emit light may be higher than a minimum value of the driving voltage applied to the second anode 122 allowing the red light-emitting layer 132R to emit light.

The cathode 140 is disposed on the red light-emitting unit 130R and the blue light-emitting unit 130B. The cathode 140 has a common structure and is commonly disposed on the plurality of sub pixels R-SP and B-SP. Further, the cathode supplies or transfers electrons to the light-emitting layers 132R and 132B of the light-emitting units 130R and 130B. For example, the cathode 140 may be formed of a metal material such as silver (Ag), magnesium (Mg), or Ag-Magnesium (Ag:Mg) or a TCO material such as ITO or IZO.

The bank 150 divides adjacent sub pixels and is disposed in a non-pixel area NSP. The bank 150 covers ends of the plurality of anodes 121 and 122. Referring to FIG. 2, the bank 150 is disposed between the first anode 121 and the second anode 122. The bank 150 is configured to cover the end of the first anode 121 and an end of the second anode 122 which is opposite to the end of the first anode 121. The bank 150 may be formed of an organic material. For example, the bank 150 may be formed of any one of polyimide and photo acryl, but is not limited thereto.

As mentioned above, the common layer 131, for example, the hole injecting layer, the p-type hole transporting layer or the hole transporting layer is configured to have a common structure. Therefore, when the driving voltage is applied to a specific sub pixel, the current leaks into the adjacent sub pixel through the common layer 131. Accordingly, an unexpected sub pixel emits light, which may cause color mixture between sub pixels. That is, the turn-on voltages between the light-emitting devices of the adjacent sub pixels can be different from each other. In such case, specifically, if a sub pixel with a higher turn-on voltage is driven at a low gray scale, a sub pixel with a lower turn-on voltage disposed adjacent to the sub pixel with the higher turn-on voltage emits light. Therefore, color mixture between sub pixels occurs and the brightness of the sub pixel is lowered. As a result, the display quality of the organic light emitting display apparatus is lowered and power consumption is increased.

In the organic light emitting display apparatus 100 according to the exemplary embodiment of the present disclosure, the current leakage between the sub pixels may be minimized by optimizing a shape of the bank 150, without changing the light-emitting device ED. Specifically, the bank 150 of the organic light emitting display apparatus 100 according to an exemplary embodiment of the present disclosure has a shape which may increase a resistance of the common layer 131 disposed on the top surface 150T of the bank 150. Therefore, the color mixture caused by the current leakage between adjacent sub pixels R-SP and B-SP is reduced. The display quality of the organic light emitting display apparatus may be improved. Further, the shape of the bank 150 between the adjacent sub pixels R-SP and B-SP is optimized without changing a design of the light-emitting device ED so that the current leakage is reduced. Therefore, the light-emitting device ED may be designed with more flexibility in their size and shape. This will be described in detail with reference to FIGS. 3 to 5.

Figure 3:
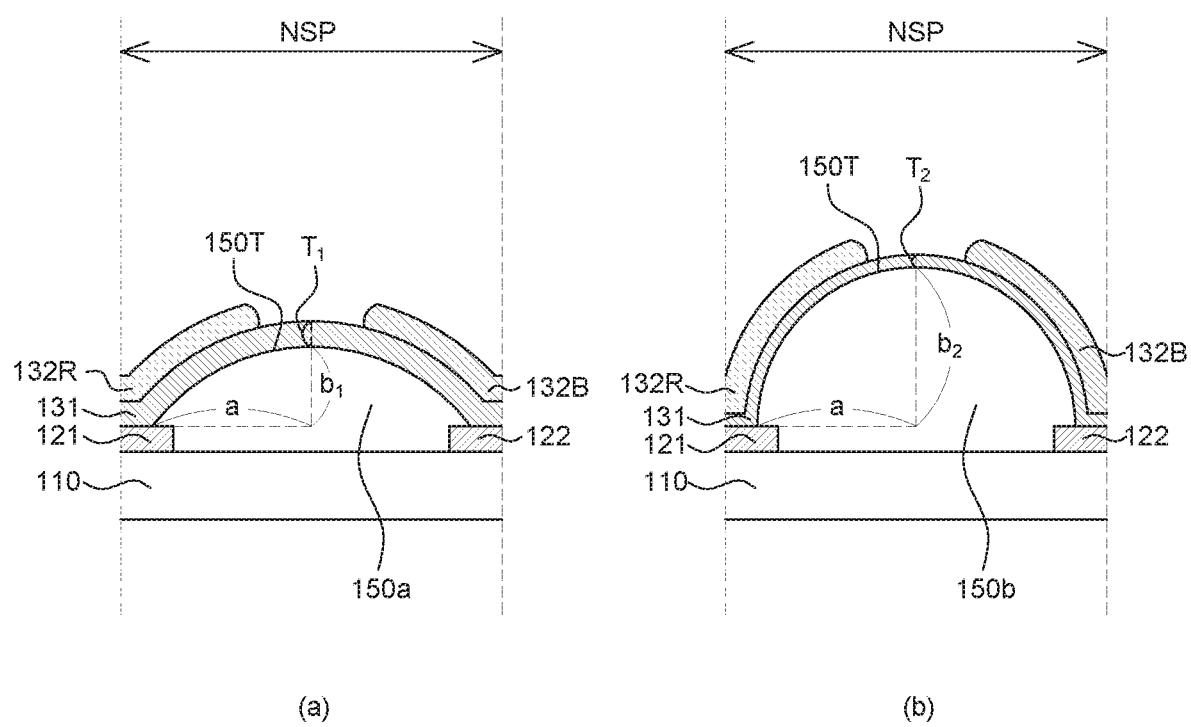
FIGS. 3 to 5 are cross-sectional views explaining resistance of a common layer in accordance with a shape of a bank.
Figure 4:
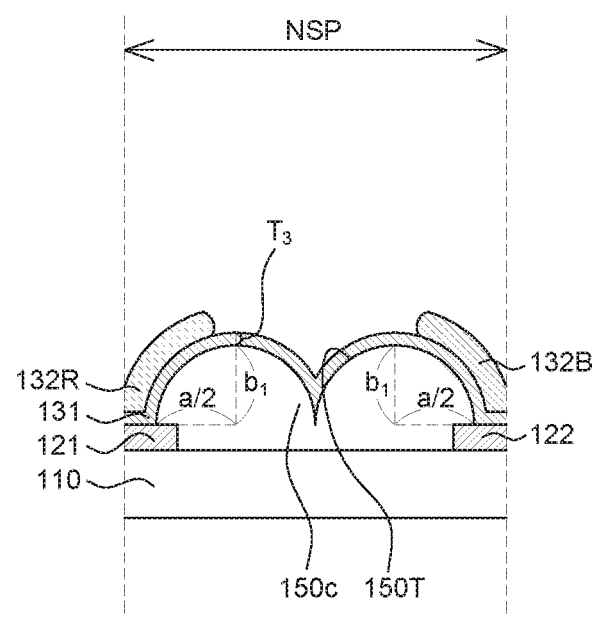
Figure 5:
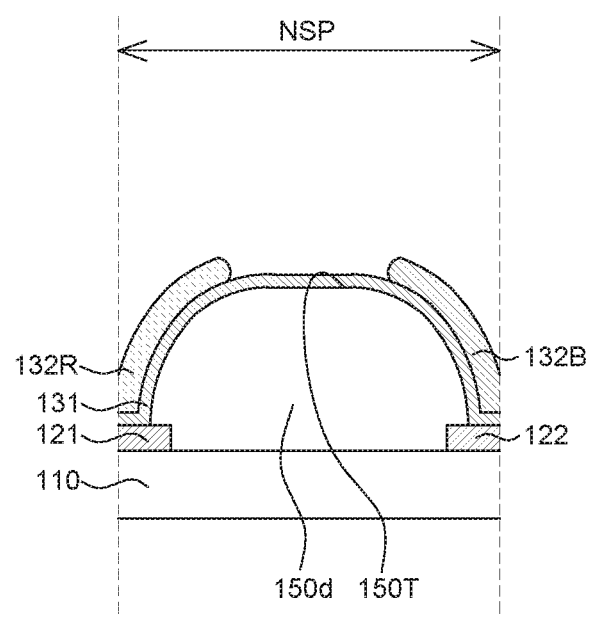

FIGS. 3 to 5 are cross-sectional views explaining resistance of a common layer in accordance with a shape of a bank 150.

First, referring to FIG. 3A, the common layer 131, a part of the red light emitting layer 132R, and a part of the blue light emitting layer 132B are disposed on a top surface 150T of a first bank 150a which is located in the non-sub pixel NSP.

The top surface 150T of the first bank 150a refers to a region where an organic layer, such as the light-emitting layers 132R and 132B or the common layer 131, is disposed. A perimeter of the top surface 150T of the first bank 150a refers to an outer circumferential length of the first bank 150a. The perimeter is defined from a point where the top surface of the first anode 121 meets the end of the first bank 150a to a point where the top surface of the second anode 122 meets the other end of the first bank 150a, on the cross-section. Therefore, a radius of the first bank 150a which defines a perimeter of the top surface 150T of the first bank 150a on the cross-section corresponds to one half of the distance from the point where the top surface of the first anode 121 meets the end of the first bank 150a to the point where the top surface of the second anode 122 meets the other end of the first bank 150a. The radius is denoted by "a" in FIG. 3A. Alternatively, the radius of the first bank 150a may be represented by a value of one half of the interval of the non-pixel area NSP. Further, a height of the first bank 150a which defines a perimeter of the top surface 150T of the first bank 150a on the cross-section corresponds to a distance from a center of an imaginary line to a center of the top surface 150T of the first bank 150a. The imaginary line is from the point where the top surface of the first anode 121 meets the end of the first bank 150a to the point where the top surface of the second anode 122 meets the other end of the first bank 150a. The height is denoted by "$b_1$" in FIG. 3A.

In this case, as illustrated in FIG. 3A, a length L of the perimeter of the top surface 150T of the first bank 150a on the cross-section satisfies the following Equation 1.

$$L \approx \frac{\pi}{2}\left\{\frac{5(a+b_1)}{4} - \frac{ab_1}{a+b_1}\right\} \quad \text{[Equation 1]}$$

Equation 1 represents an approximate value indicating the length of the perimeter of an ellipse using Simpson's rule.

The thickness of the common layer 131 located on the top surface 150T of the bank 150a has a value of $T_1$.

Next, referring to FIG. 3B, a height $b_2$ of the second bank 150b has a higher value than the height $b_1$ of the first bank 150a illustrated in FIG. 3A. A radius "a" of the second bank 150b is equal to the radius "a" of the first bank 150a. That is, according to this structure, only the height of the bank is changed to have a larger value without changing an interval between adjacent sub pixels R-SP and B-SP, that is, an interval of the non-sub pixels NSP.

In this case, the perimeter of the top surface 150T of the second bank 150b on the cross-section has a larger value than the perimeter of the top surface of the first bank 150a on the cross-section. For example, when the radius a of the first bank 150a is 11 μm and the height $b_1$ of the first bank 150a is 2 μm, the perimeter of the top surface 150T of the first bank 150a is approximately 7.28π μm, in accordance with Equation 1. In comparison with this, when the radius a of the second bank 150b is 11 μm, which is equal to the radius "a" of the first bank 150a and the height $b_2$ of the second bank 150b is 4 μm, the perimeter of the top surface 150T of the second bank 150b is approximately 7.91π μm, in accordance with Equation 1.

That is, as the height of the bank increases, the perimeter of the top surface of the bank also increases. This means that the common layer 130 located on the bank is formed to expand on a wider surface. Therefore, the thickness of the common layer 131 has a relatively small value. To be more specific, when the intervals of the non-sub pixels NSP are equal to each other, amounts of the common layers 131 which are deposited on the bank are equal. Further, the perimeter of the top surface 150T of the second bank 150b is larger than the perimeter of the top surface 150T of the first bank 150a. Therefore, the thickness $T_2$ of the common layer 131 formed on the top surface 150T of the second bank 150a is smaller than the thickness $T_1$ of the common layer 131 formed on the top surface 150T of the first bank 150a.

When the thickness of the common layer 131 is reduced, the resistance of the common layer 131 increases. Therefore, an amount of leaked current which flows into the common layer 131 is reduced. Generally, the resistance is proportional to a length of an object and is proportional to a cross section thereof. Since the length of the common layer 131 is proportional to the perimeter of the top surface of the bank, the length of the common layer 131 located on the top surface 150T of the second bank 150b is larger than the length of the common layer 131 located on the top surface 150T of the first bank 150a. Further, as mentioned above, the thickness $T_2$ of the common layer 131 located on the top surface 150T of the second bank 150b is smaller than the thickness $T_1$ of the common layer 131 located on the top surface 150T of the first bank 150a. Accordingly, the resistance of the common layer 131 located on the top surface 150T of the second bank 150b is larger than the resistance of the common layer 131 located on the top surface 150T of the first bank 150a. Therefore, the amount of leaked current flowing into the common layer 131 located on the top surface 150T of the second bank 150b may be relatively reduced.

In order to minimize the color mixture problem between adjacent sub pixels R-SP and B-SP, the leaked current flowing onto the common layer 131 located on the bank 150 disposed between the adjacent sub pixels R-SP and B-SP may have a value of 15 μA or lower. In other words, the leaked current flowing onto the common layer 131 on the bank 150 in the non-sub pixel NSP may have a value of 15 μA or lower. In such case, the blue light-emitting layer 132B of the blue light-emitting device B-ED having a relatively large turn-on voltage emits light. However, the red light-emitting layer 132R of the red light-emitting device R-ED having a relatively small turn-on voltage may not emit light.

In order to allow the leaked current flowing onto the common layer 131 on the bank 150 in the non-sub pixel NSP to have a value of 15 μA or lower, the resistance of the common layer 131 on the bank 150 needs to have a large value. As described above, when the intervals between adjacent sub pixels R-SP and B-SP are equal to each other, the perimeter of the top surface 150T of the bank 150 may be increased by increasing the height of the bank 150. Thus, the resistance of the common layer 131 on the bank 150 may increase. Desirably, the shape of the bank 150 is configured such that the perimeter of the top surface 150T of the bank 150 on the cross-section is 7π μm or larger. Therefore, the leaked current flowing onto the common layer 131 on the bank 150 in the non-sub pixel NSP may be reduced. For example, as illustrated in FIG. 3, when the bank 150 has an elliptical shape in which a radius is 11 μm and a height is 2 μm or larger, the perimeter of the top surface 150T of the bank 150 on the cross-section has a value of 7π μm. Therefore, the current leakage between the red sub pixel R-SP and the blue sub pixel B-SP is reduced, so that the color mixture between sub pixels R-SP and B-SP is also reduced. Therefore, the display quality of the organic light emitting display apparatus 100 may be improved.

Referring to FIG. 4, at the same interval as the interval of the non-sub pixels NSP in which the first bank 150a illustrated in FIG. 3A is disposed, a third bank 150c has the same height $b_1$ as the first bank 150a and has a plurality of peaks. Specifically, as illustrated in FIG. 4, the third bank 150c has a shape in which two ellipses whose radius is a/2 and height is $b_1$ are connected. In other words, the third bank 150c has a shape formed by two peaks whose radius is a/2 and height is $b_1$.

In this case, the perimeter of the top surface 150T of the third bank 150c on the cross-section has a value larger than the perimeter of the top surface 150T of the first bank 150a on the cross-section. For example, when the radius a of the first bank 150a is 11 μm and the height 151 of the first bank 150a is 2 μm, the perimeter of the top surface 150T of the first bank 150a is approximately 7.28π μm, in accordance with Equation 1. Meanwhile, when the radius a/2 of one ellipse of the third bank 150c is 5.5 μm and the height $b_1$ is 2 μm, the perimeter of the top surface 150T of the third bank 150c is approximately 7.91π μm, in accordance with Equation 1

Since the perimeter of the top surface 150T of the third bank 150c is larger than the perimeter of the top surface 150T of the first bank 150a, a thickness $T_3$ of the common layer 131 formed on the top surface 150T of the third bank 150c is smaller than the thickness $T_1$ of the common layer 131 formed on the top surface 150T of the first bank 150a. Accordingly, the resistance of the common layer 131 located on the top surface 150T of the third bank 150c is larger than the resistance of the common layer 131 located on the top surface 150T of the first bank 150a. Therefore, the amount of leaked current flowing into the common layer 131 located on the top surface 150T of the third bank 150c may be relatively reduced. That is, the bank 150c is configured such that the perimeter of the top surface 150T on the cross-section has a value of 7π μm or larger and the leaked current flowing onto the common layer 131 on the third bank 150c has a value of 15 μA or lower. Therefore, the current leakage between adjacent sub pixels R-SP and B-SP is reduced, thereby the color mixture between the sub pixels R-SP and B-SP may be reduced.

The bank of the organic light emitting display apparatus 100 according to an exemplary embodiment of the present disclosure may have various shapes whose perimeter of the top surface of the bank on the cross-section is 7π μm or larger. For example, the bank may have an elliptical shape having at least one peak as illustrated in FIGS. 3 and 4 or may have a circular shape whose top surface is flat, as illustrated in FIG. 5. Specifically, referring to FIG. 5, a perimeter of a top surface 150T of a fourth bank 150d is 7π μm or larger and the leaked current flowing onto the common layer 131 on the fourth bank 150d may be 15 μA or lower. However, the present disclosure is not limited thereto. The bank 150 between adjacent sub pixels R-SP and B-SP may be implemented to have various shapes designed such that the perimeter of the top surface 150T of the bank 150 on the cross-section is 7π μm or larger. Therefore, the unexpected current leakage through the common layer 131 on the bank 150 is reduced, so that the display quality of the organic light emitting display apparatus 100 may be improved. Further, a shape of a bank 150 is optimized without changing a design of the light-emitting devices R-ED and B-ED to reduce the current leakage. Therefore, the light-emitting devices R-ED and B-ED may be freely designed. Further, the perimeter of the top surface of the bank 150 is optimized by adjusting only the height or the shape of the bank 150 without changing an interval between adjacent sub pixels R-SP and B-SP, that is, intervals of the non-sub pixels NSP. Therefore, an aperture ratio of the organic light emitting display apparatus 100 can increase.

Figure 6:
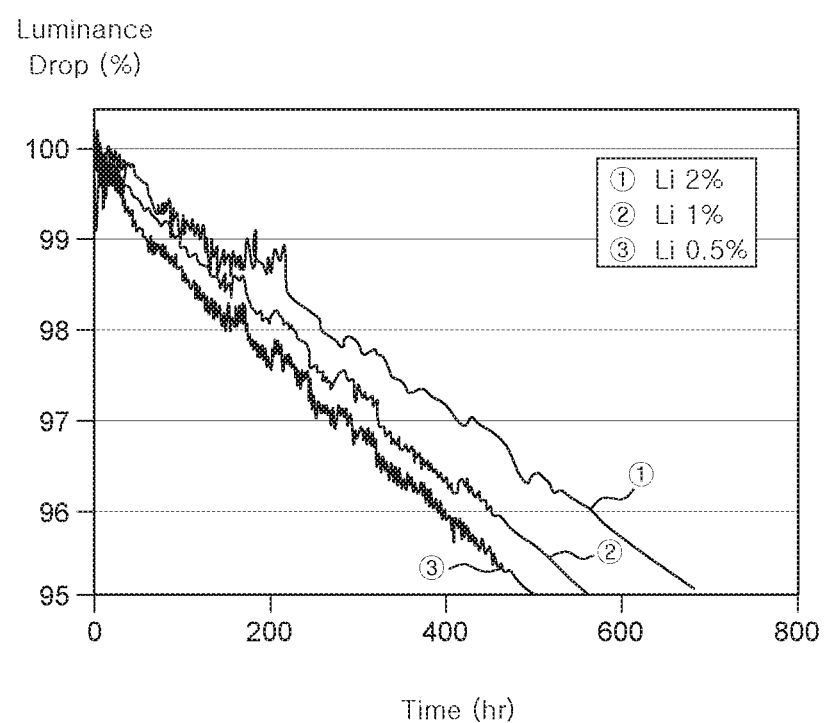
FIG. 6 is a graph illustrating a lifetime of an organic light emitting display apparatus in accordance with an amount of a dopant included in a common layer.

FIG. 6 is a graph illustrating a lifetime of an organic light emitting display apparatus 100 in accordance with an amount of a dopant included in a common layer 131.

As described above, the resistance of the common layer located on the bank is increased by optimizing a shape of the bank disposed between adjacent sub pixels, to reduce leaked current which may be generated between the adjacent sub pixels.

When the common layer on the bank includes a hole transporting layer on which an inorganic material is doped, for example, a p-type dopant is doped, as a doped amount of the inorganic material is increased, a hole injecting or hole transporting capacity of the light-emitting device is improved. However, an amount of current which leaks into the adjacent sub pixel through the common layer, also increases.

That is, in order to reduce the current leakage between adjacent sub pixels, an amount of the inorganic material which is doped on the common layer may be reduced, which may result in lowering the performance of the light-emitting device. In contrast, according to the exemplary embodiment of the present disclosure, the shape of the bank of the organic light emitting apparatus is optimized to increase the resistance of the common layer located on the bank. Therefore, the amount of the inorganic material doped on the common layer does not need to be reduced, so that the performance lowering of the light-emitting device may be minimized.

Referring to FIG. 6, in a structure where lithium (Li) which is an inorganic material is doped on the common layer, when an amount of doped lithium (Li) is 0.5% and it is assumed that initial brightness of the organic light emitting display apparatus is 100%, a time when the brightness is reduced by 95% may be approximately 500 hr. In comparison with this, when an amount of lithium (Li) which is doped on the common layer is 1%, a time when the brightness is reduced by 95% is increased to approximately 560 hr. Further, when an amount of lithium (Li) which is doped on the common layer is 2%, it is understood that a time when the brightness is reduced by 95% is significantly increased to approximately 690 hr.

That is, according to the exemplary embodiment of the present disclosure, the current leakage between the adjacent sub pixels is minimized by optimizing a shape of the bank located between adjacent sub pixels. Therefore, there is no need to reduce an amount of inorganic material included in the common layer of the organic light-emitting device, so that a lifetime of the organic light emitting display apparatus may be prolonged.

The exemplary embodiments of the present disclosure can also be described as follows:

According to an aspect of the present disclosure, an organic light emitting display apparatus includes: a first anode; a second anode which spaced apart from the first anode; a bank between the first anode and the second anode; and at least one common layer extending onto a top surface of the first anode, a top surface of the bank, and a top surface of the second anode, in which a perimeter of the top surface of the bank on the cross-section is 7π μm or larger. Accordingly, current leakage between adjacent sub pixels may be minimized.

The organic light emitting display apparatus according to an exemplary embodiment of the present disclosure may further include a red light-emitting layer which overlaps the first anode; and a blue light-emitting layer which overlaps the second anode.

A minimum value of a driving voltage applied to the first anode to allow the blue light-emitting layer to emit light may be higher than a minimum value of a driving voltage applied to the second anode to allow the red light-emitting layer to emit light.

When the blue light-emitting layer emits light, a leaked current flowing onto the common layer on the top surface of the bank may be 15 μA or lower so as not to allow the red light-emitting layer to emit light.

The bank may have a plurality of peaks.

According to another aspect of the present disclosure, an organic light emitting display apparatus includes a plurality of anodes, a cathode on the plurality of anodes; at least one common layer between the plurality of anodes and the cathodes shared among adjacent sub pixels; and a bank which divides the adjacent sub pixels and covers ends of the plurality of anodes, in which the bank has a shape in which a leaked current flowing onto the common layer disposed on the bank has a value of 15 μA or lower.

The bank may have a shape such that a perimeter of the bank on the cross-section is 7π μm or larger.

The bank may have a plurality of peaks.

The adjacent sub pixels may be a red sub pixel and a blue sub pixel.

The organic light emitting display apparatus according to an exemplary embodiment of the present disclosure may further include a red light-emitting layer corresponding to the red sub pixel; and a blue light-emitting layer corresponding to the blue sub pixel.

A turn-on voltage to drive the red light-emitting layer may be smaller than a turn-on voltage to drive the blue light-emitting layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display apparatus, comprising:
    a first anode;
    a second anode which spaced apart from the first anode;
    a bank between the first anode and the second anode; and
    at least one common layer extending onto a top surface of the first anode, a top surface of the bank, and a top surface of the second anode,
    wherein a perimeter of the bank on a cross-sectional view is 7 m or larger,
    wherein the perimeter of the bank is defined from a point where the top surface of the first anode meets the end of the bank to a point where the top surface of the second anode meets the other end of the bank on the cross-sectional view.

2. The organic light emitting display apparatus according to claim 1, further comprising:
    a red light-emitting layer that overlaps the first anode; and
    a blue light-emitting layer that overlaps the second anode.

3. The organic light emitting display apparatus according to claim 2, wherein a minimum value of a driving voltage applied to the second anode to allow the blue light-emitting layer to emit light, is higher than a minimum value of a driving voltage applied to the first anode to allow the red light-emitting layer to emit light.

4. The organic light emitting display apparatus according to claim 3, wherein when the blue light-emitting layer emits light, a leaked current flowing onto the common layer on the top surface of the bank is 15 A or lower so as not to allow the red light-emitting layer to emit light.

5. The organic light emitting display apparatus according to claim 1, wherein the bank has a plurality of peaks.

6. An organic light emitting display apparatus, comprising:
    a plurality of anodes;
    a cathode on the plurality of anodes;
    at least one common layer between the plurality of anodes and cathodes shared among adjacent sub pixels; and
    a bank that divides the adjacent sub pixels and covers ends of the plurality of anodes,
    wherein the bank with a shape in which a leaked current flowing onto the common layer on the bank has a value of 15 A or lower,
    wherein the bank has a shape such that a perimeter of the bank on a cross-sectional view is 7 m or larger,
    wherein the perimeter of the bank is defined from a point where a top surface of a first anode of the plurality of anodes meets the end of the bank to a point where a top surface of a second anode of the plurality of anodes meets the other end of the bank on the cross-sectional view.

7. The organic light emitting display apparatus according to claim 6, wherein the bank has a plurality of peaks.

8. The organic light emitting display apparatus according to claim 6, wherein the adjacent sub pixels are a red sub pixel and a blue sub pixel.

9. The organic light emitting display apparatus according to claim 8, further comprising:
    a red light-emitting layer corresponding to the red sub pixel; and
    a blue light-emitting layer corresponding to the blue sub pixel.

10. The apparatus according to claim 9, wherein a turn-on voltage to drive the red light-emitting layer is smaller than a turn-on voltage to drive the blue light-emitting layer.

* * * * *